United States Patent
Chen et al.

(10) Patent No.: US 6,211,095 B1
(45) Date of Patent: Apr. 3, 2001

(54) METHOD FOR RELIEVING LATTICE MISMATCH STRESS IN SEMICONDUCTOR DEVICES

(75) Inventors: Yong Chen, Mountain View; Scott W. Corzine, Sunnyvale; Theodore I. Kamins, Palo Alto; Michael J. Ludowise, San Jose; Pierre H. Mertz, Mountain View; Shih-Yuan Wang, Palo Alto, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/221,025

(22) Filed: Dec. 23, 1998

(51) Int. Cl.[7] .......................... H01L 21/31; H01L 21/469
(52) U.S. Cl. ............................................. 438/766; 438/765
(58) Field of Search .................................. 438/473, 765, 438/766, 769

(56) References Cited

U.S. PATENT DOCUMENTS

| | | | |
|---|---|---|---|
| 4,523,963 | * 6/1985 | Ohta | 148/1.5 |
| 4,845,044 | 7/1989 | Ariyoshi et al. | 437/24 |
| 5,795,813 | * 8/1998 | Hughes | 438/423 |
| 5,970,366 | * 10/1999 | Okonogi | 438/471 |
| 5,989,974 | * 11/1999 | Yamada | 438/407 |

FOREIGN PATENT DOCUMENTS

WO 84/02034   5/1984   (WO) .................... H01L/21/20

OTHER PUBLICATIONS

K. Das et al. "Molecular Beam Epitaxial Growth of GaAs on Silicon with Buried Implanted Oxides", Electronics Letters, vol. 24 No. 1, Jan. 7, 1988, pp. 67–68.

* cited by examiner

Primary Examiner—Charles Bowers
Assistant Examiner—Nema Berezny

(57) ABSTRACT

A method for growing a crystalline layer that includes a first material on a growth surface of a crystalline substrate of a second material, wherein the first material and the second material have different lattice constants. A buried layer is generated in the substrate such that the buried layer isolates a layer of the substrate that includes the growth surface from the remainder of the substrate. The first material is then deposited on the growth surface at a growth temperature. The isolated layer of the substrate has a thickness that is less than the thickness at which defects are caused in the crystalline lattice of the second material by the first material crystallizing thereon. The buried layer is sufficiently malleable at the growth temperature to allow the deformation of the lattice of the isolated layer without deforming the remainder of the substrate. The present invention may be utilized for growing III–V semiconducting material layers on silicon substrates. In the case of silicon-based substrates, the buried layer is preferably $SiO_2$ that is sufficiently malleable at the growth temperature to allow the deformation of the isolated substrate layer.

7 Claims, 1 Drawing Sheet

METHOD FOR RELIEVING LATTICE MISMATCH STRESS IN SEMICONDUCTOR DEVICES

FIELD OF THE INVENTION

The present invention relates to the fabrication of semiconductors based on GaN and similar materials, and more particularly, to a method for relieving the stress generated when layers of such materials are grown on a substrate having lattice constants that differ from those of the grown layer.

BACKGROUND OF THE INVENTION

Group II–I–V materials such as the GaN material system are particularly useful in constructing lasers and LEDs in the blue and green wavelengths. The construction of an optical device based on these materials typically begins with the deposition of a layer III–V material on a substrate such as sapphire or Si. Ideally, one would like to grow an optical device such as a laser on silicon so that additional circuit components can be fabricated on the same die. Because of the lattice mismatch, such growth is not currently practical. Accordingly, lasers are often grown on sapphire. However, there is still a significant mismatch in the lattice constants of sapphire and GaN. For example, the lattice constant for GaN differs from that of sapphire by approximately 13–16%. During the growth of the GaN layer, the substrate and the GaN layer tend to keep their original lattice parameters; hence, there is a mismatch between the lattice parameters between the two layers. This mismatch generates stress in the GaN layer which, in turn, leads to defects in the layer. Such defects interfere with the construction of further layers on the base layer and reduce the yield of usefull devices.

Broadly, it is the object of the present invention to provide an improved method for growing Group III–V layers on a substrate having a substantially different lattice constant.

It is a further object of the present invention to provide a method for growing GaN on Si in which the stress generated by the lattice mismatch is substantially reduced.

These and other objects of the present invention will become apparent to those skilled in the art from the following detailed description of the invention and the accompanying drawings.

SUMMARY OF THE INVENTION

The present invention is a method for growing a crystalline layer that includes a first material on a growth surface of a crystalline substrate of a second material, wherein the first material and second material have different lattice constants. A buried layer is generated in the substrate such that the buried layer isolates a layer of the substrate that includes the growth surface from the remainder of the substrate. The first material is then deposited on the growth surface at a growth temperature. The isolated layer of the substrate has a thickness that is less than the thickness at which defects are caused in the crystalline lattice of the second material by the first material crystallizing thereon. The buried layer is sufficiently malleable at the growth temperature to allow the deformation of the lattice of the isolated layer without deforming the remainder of the substrate. The present invention may be utilized for growing III–V semiconducting material layers on silicon substrates. In the case of silicon-based substrates, the buried layer is preferably $SiO_2$ doped with impurities, which is sufficiently malleable at the growth temperature to allow the deformation of the isolated substrate layer.

DETAILED DESCRIPTION OF THE INVENTION

Figure 1:
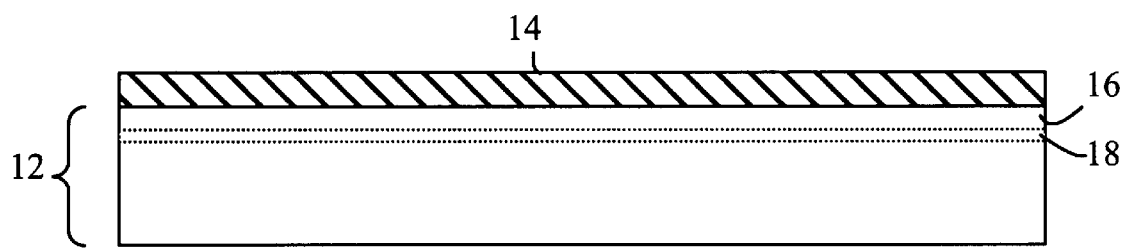
FIG. 1 is cross-sectional view of a portion of a Si substrate on which a GaN layer has been grown.

To simplify the following discussion, a reference to GaN is to be understood as including the entire GaN material system of GaN, AlN, InN, AlGaN, InGaN, AlGaNP, AlGaNAs, InGaNP, InGaNAs, etc. unless the context makes it clear that only GaN is intended. The manner in which the present invention obtains its advantages can be more easily understood with reference to a specific example. Consider the growth of a GaN layer on a Si substrate. The lattice constant of GaN differs from that of Si by approximately 20%. As noted above, this mismatch leads to stress in the GaN layer. The present invention overcomes this stress by growing the GaN on a very thin Si layer, which is supported on the substrate by a buried layer that relieves the stress. The GaN layer, which is thicker than the thin Si layer, distorts the Si layer (this is called the compliant layer), and hence, the lattice mismatch stress is taken up by the thin Si layer rather than the GaN layer.

The manner in which the thin Si layer is generated can be more easily understood with reference to FIG. 1, which is a cross-sectional view of a portion of a Si substrate 12 on which a GaN layer 14 has been grown. A thin Si layer 16 (approximately 100 nm) is isolated on the surface of Si substrate 12 by ion implantation of the surface of substrate 12 with oxygen. The energy of the oxygen atoms is sufficient to assure that the oxygen atoms penetrate to locations below the position of Si layer 16. The oxygen implantation generates a buried $SiO_2$ layer 18. For example, a buried $SiO_2$ layer that is approximately 400 nm thick and 180 nm from the surface of a Si wafer can be generated by implanting oxygen at a dose of $2\times10^{18}/cm^2$ at an energy of 180 keV. The wafer is typically heated to 500° C. during the implantation process. The wafer is annealed at a temperature greater than 1200° C. after the implantation. If a thinner compliant layer 16 is desired, the implantation energy can be reduced or layer 16 can be etched to the desired thickness. In addition, layer 16 can be thinned by oxidizing the surface of the layer and stripping the oxide. The temperature at which the $SiO_2$ layer 18 becomes malleable is controlled by the implantation of impurities such as phosphorous, which are also introduced by implantation. $SiO_2$ layer 18 is implanted with impurities at a concentration that assures that $SiO_2$ layer 18 is malleable at the growth temperature of the GaN layer. Hence, when the substrate is heated to the GaN growth temperature, the complaint Si layer 16 can be stretched or compressed independently of the remainder of the Si substrate, since the $SiO_2$ layer takes up the stress resulting from the deformation of Si layer 16.

The method discussed above can be applied to other substrates. In general, a buried layer that is malleable at the growth temperature is generated in the substrate by ion implantation into the substrate at a depth sufficient to isolate a thin complaint layer of substrate material above the malleable buried layer. In the case of other silicon-based substrates such as SiC, the buried layer is preferably $SiO_2$ that has been doped to become malleable at the growth temperature. In the case of non-silicon substrates such as sapphire, the $SiO_2$ layer can be generated by implanting both the oxygen and silicon components of the $SiO_2$.

It should be noted that the compliant layer need not be planar. For example, the compliant layer can be incorporated on a patterned substrate such as shown in U.S. Pat. No. 4,810,664. The buried layer can also be any amorphous layer under a layer of silicon or substrate. For example, the fabrication of silicon-on-insulator films is well known in the art. The reader is directed to "Silicon-on-insulator films by oxygen implantation and lamp annealing", G. K. Celler, Solid State Technology, March 1987, pp. 93–98 for a more detailed discussion of such films. In addition, an amorphous buried layer created by damaging the crystalline structure of the substrate can also be utilized in place of the $SiO_2$ layer discussed above. An amorphous layer is substantially weaker than a crystalline layer. Hence, the overlying crystalline layer can be stretched or compressed, since the amorphous layer can take up the relative displacement.

The method of the present invention may be utilized to provide an integrated circuit substrate that can be used as a starting material for the fabrication of light emitting devices based on III–V semiconductors. The substrate includes a Group III–V semiconducting material layer on the surface of a substrate having the buried layer described above. The III–V layer can be used as the base layer for the fabrication of other devices. By mass producing such a substrate, the cost of fabricating such light emitting devices can be substantially reduced.

It should also be noted that the present invention provides a method for combining III–V based semiconducting elements including light emitting devices and transistors with conventional CMOS or other silicon-based circuitry. At present, a circuit combining such elements must be assembled from two different dies, one having the silicon-based circuitry and one having the III–V semiconductor based devices.

Various modifications to the present invention will become apparent to those skilled in the art from the foregoing description and accompanying drawings. Accordingly, the present invention is to be limited solely by the scope of the following claims.

What is claimed is:

1. A method for growing a crystalline layer comprising a first material on a growth surface of a crystalline substrate comprising a second material, wherein said first material and said second material have different lattice constants, said method comprising the steps of:

generating a buried layer in said substrate, said buried layer isolating a layer of said substrate that includes said growth surface from the remainder of said substrate; and depositing said first material on said growth surface at a growth temperature, wherein said isolated layer of said substrate has a thickness that is less than that thickness at which the crystalline lattice of said second material will deform in response to said first material crystallizing thereon, and wherein said buried layer is sufficiently malleable to allow said deformation without deforming the remainder of said substrate.

2. The method of claim 1 wherein said step of generating said buried layer comprises the step of implanting ions of a first element into said substrate.

3. The method of claim 2 wherein said second material is silicon and said first element is oxygen.

4. The method of claim 3 wherein said first material is a III$\geq$V semiconducting material.

5. The method of claim 4 wherein said III–V semiconducting material comprises GaN, AlN, InN, AlGaN, InGaN, AlaNP, AlGaNAs, InGahNP, or InaGaNAs.

6. The method of claim 3 further comprising the step of implanting ions of a second element at a predetermined density into said substrate, said second element and predetermined density being chosen such that said buried layer comprises $SiO_2$ that is malleable at said growth temperature, said second element being different Si and O.

7. The method of claim 1 wherein said buried layer comprises an amorphous region in said substrate said amorphous region having substantially the same chemical composition as said substrate.

* * * * *